US012610483B2

(12) United States Patent
Hadav et al.

(10) Patent No.: US 12,610,483 B2
(45) Date of Patent: Apr. 21, 2026

(54) CHASSIS NODE COUPLING SYSTEM

(71) Applicant: EMC IP Holding Company, LLC, Hopkinton, MA (US)

(72) Inventors: Aric Hadav, Tel Aviv (IL); Amital Alkalay, Kadima (IL); Thomas N. Dibb, Rutland, MA (US)

(73) Assignee: EMC IP Holding Company, LLC, Hopkinton, MA (US)

( * ) Notice: Subject to any disclaimer, the term of this patent is extended or adjusted under 35 U.S.C. 154(b) by 141 days.

(21) Appl. No.: 17/508,162

(22) Filed: Oct. 22, 2021

(65) Prior Publication Data

US 2023/0127240 A1 Apr. 27, 2023

(51) Int. Cl.
H05K 7/14 (2006.01)
H05K 5/02 (2006.01)
H05K 9/00 (2006.01)
*F16B 2/18* (2006.01)

(52) U.S. Cl.
CPC ........... H05K 5/023 (2013.01); H05K 7/1401 (2013.01); H05K 7/1411 (2013.01); H05K 9/0062 (2013.01); *F16B 2/18* (2013.01); *H05K 7/1489* (2013.01)

(58) Field of Classification Search
CPC .... H05K 7/1488; H05K 7/1489; H05K 5/023; H05K 9/0062; H05K 7/1411; H05K 7/16; H05K 7/1402; H05K 7/1404; H05K 7/1405; H05K 7/1407; H05K 7/1408; H05K 7/1409; H05K 7/1415; H05K 7/1421; H05K 7/1425; H05K 7/1487;

H05K 7/1492; H05K 7/18; H05K 7/186; G06F 1/181; G06F 1/182; G06F 1/183; G06F 1/184; G06F 1/185; G06F 1/186; G06F 1/187
See application file for complete search history.

(56) References Cited

U.S. PATENT DOCUMENTS

| | | | | |
|---|---|---|---|---|
| 4,003,614 A | * | 1/1977 | Geer | E05B 65/46 292/240 |
| 5,668,696 A | * | 9/1997 | Schmitt | G11B 33/127 439/928.1 |
| 5,791,753 A | * | 8/1998 | Paquin | G06F 1/181 312/223.1 |
| 6,065,612 A | * | 5/2000 | Rinderer | H05K 7/16 211/175 |
| 6,137,684 A | * | 10/2000 | Ayd | H05K 7/1411 361/608 |
| 6,547,289 B1 | * | 4/2003 | Greenheck | E05B 65/46 292/200 |
| 7,085,131 B2 | * | 8/2006 | Peng | G06F 1/184 361/679.33 |

(Continued)

OTHER PUBLICATIONS

RackSolutions 3U 4-Post Universal Rack Mount Rail Kit with Cable Management Bar for all Servers, Mar. 18, 2015, https://www.amazon.com/RackSolutions-3U-Universal-Rack-Rails/dp/B00UVKAKKO/ref=sr_1_6?keywords=3u+rack+rails&qid=1685594100&sr=8-6. (Year: 2015).*

*Primary Examiner* — Gage Crum
(74) *Attorney, Agent, or Firm* — Brian J. Colandreo; Heath M. Sargeant; Holland & Knight LLP

(57) ABSTRACT
A chassis node coupling system includes a chassis node configured to be received at a first end of a chassis assembly, wherein the chassis node size exceeds the chassis assembly size. A latch assembly with one or more coupling assemblies may be configured to releasably couple the chassis node to the chassis assembly.

12 Claims, 4 Drawing Sheets

12

(56) References Cited

U.S. PATENT DOCUMENTS

| | | | | | |
|---|---|---|---|---|---|
| 7,791,890 B2* | 9/2010 | Ishida | H05K 7/1492 | | |
| | | | 361/796 | | |
| 8,496,210 B2* | 7/2013 | Chang | G06F 1/181 | | |
| | | | 248/221.11 | | |
| 8,556,219 B2* | 10/2013 | Li | G06F 1/187 | | |
| | | | 248/220.21 | | |
| 9,215,828 B1* | 12/2015 | Yang | H05K 7/1487 | | |
| 9,681,574 B1* | 6/2017 | Chen | H05K 7/1489 | | |
| 9,854,703 B1* | 12/2017 | Yousif | H05K 7/18 | | |
| 9,930,804 B2* | 3/2018 | Lu | H05K 7/1489 | | |
| 10,149,402 B1* | 12/2018 | Dufresne | G06F 13/4068 | | |
| 10,863,647 B1* | 12/2020 | Escamilla | H05K 5/023 | | |
| 2003/0002261 A1* | 1/2003 | Berry | H05K 7/1489 | | |
| | | | 361/727 | | |
| 2003/0109175 A1* | 6/2003 | Skinner | H01R 13/6596 | | |
| | | | 439/607.01 | | |
| 2008/0089021 A1* | 4/2008 | Deng | G06F 1/187 | | |
| | | | 361/825 | | |
| 2009/0073896 A1* | 3/2009 | Gillingham | G06F 9/5061 | | |
| | | | 370/255 | | |
| 2010/0110628 A1* | 5/2010 | Barrenechea | H05K 7/1491 | | |
| | | | 361/679.48 | | |
| 2011/0273850 A1* | 11/2011 | Chen | H05K 5/023 | | |
| | | | 292/336.3 | | |
| 2011/0309730 A1* | 12/2011 | Retchloff | E05C 3/14 | | |
| | | | 292/210 | | |
| 2012/0229971 A1* | 9/2012 | Mills | H05K 7/1489 | | |
| | | | 361/679.02 | | |
| 2012/0242203 A1* | 9/2012 | Gong | G06F 1/187 | | |
| | | | 312/223.2 | | |
| 2013/0241377 A1* | 9/2013 | Zhang | G06F 1/181 | | |
| | | | 403/188 | | |
| 2016/0302329 A1* | 10/2016 | Kang | H05K 7/20554 | | |
| 2021/0127522 A1* | 4/2021 | Wang | H05K 5/03 | | |
| 2022/0248546 A1* | 8/2022 | Di Dihuweii | H05K 7/1489 | | |
| 2023/0024568 A1* | 1/2023 | Chen | H05K 5/023 | | |
| 2023/0070194 A1* | 3/2023 | Lu | H05K 7/1489 | | |
| 2023/0077114 A1* | 3/2023 | Korta | H05K 5/0065 | | |

* cited by examiner server system disk array systems storage processor systems storage processor / disk systems battery backup systems

CHASSIS NODE COUPLING SYSTEM

TECHNICAL FIELD

This disclosure relates to IT components and, more particularly, to systems for coupling various sizes of chassis nodes within IT components.

BACKGROUND

In today's IT infrastructure, high availability is of paramount importance. Specifically, critical (and sometimes non-critical) components within an IT infrastructure are often layered in redundancy. For example, primary servers may be supported by backup servers; primary switches may be supported by backup switches; primary power supplies may be supported by backup power supplies; and primary storage systems may be supported by backup storage systems.

Oftentimes, various IT components are mounted within IT racks and need to be serviced in the field. As IT components and particular modules used in IT components are upgraded, traditional chassis designs are unable to adapt to changing dimensions needed for these upgraded components. Accordingly, with new modules and IT components, the physical chassis structure must also be replaced, resulting in IT infrastructure unavailability.

SUMMARY OF DISCLOSURE

In one implementation, a chassis node coupling system includes a chassis node configured to be received at a first end of a chassis assembly, wherein the chassis node size exceeds the chassis assembly size. A latch assembly with one or more coupling assemblies may be configured to releasably couple the chassis node to the chassis assembly.

One or more of the following features may be included. The chassis assembly may be enclosed in electromagnetic shielding. The chassis node may be enclosed in electromagnetic shielding. The one or more coupling assemblies of the latch assembly may be configured to engage with one or more corresponding coupling features on the chassis assembly. the one or more corresponding coupling features may be positioned at predefined distance from the first end of the chassis assembly. The latch assembly may include a handle portion positioned adjacent to a distal end of the chassis node and coupled to the one or more coupling assemblies. The handle portion may be configured to decouple the one or more coupling assemblies of the latch assembly from the chassis assembly. The chassis node may be configured to be releasably coupled within the first end of the chassis assembly to a computing device while the computing device is online. The chassis assembly may be a portion of an IT component. The IT component may be chosen from the group consisting of: a server system, a disk array system, a storage processor system, and a storage processor/disk system.

In another implementation, an IT component includes a chassis assembly and a chassis node coupling system. The chassis node coupling system may include a chassis node configured to be received at a first end of a chassis assembly, wherein the chassis node size exceeds the chassis assembly size. A latch assembly with one or more coupling assemblies may be configured to releasably couple the chassis node to the chassis assembly.

One or more of the following features may be included. The chassis assembly may be enclosed in electromagnetic shielding. The chassis node may be enclosed in electromagnetic shielding. The one or more coupling assemblies of the latch assembly may be configured to engage with one or more corresponding coupling features on the chassis assembly. the one or more corresponding coupling features may be positioned at predefined distance from the first end of the chassis assembly. The latch assembly may include a handle portion positioned adjacent to a distal end of the chassis node and coupled to the one or more coupling assemblies. The handle portion may be configured to decouple the one or more coupling assemblies of the latch assembly from the chassis assembly. The chassis node may be configured to be releasably coupled within the first end of the chassis assembly to a computing device while the computing device is online. The chassis assembly may be a portion of an IT component. The IT component may be chosen from the group consisting of: a server system, a disk array system, a storage processor system, and a storage processor/disk system. The IT component may be chosen from the group consisting of: a 1 U IT component; a 2 U IT component; and a 3 U IT component.

The details of one or more implementations are set forth in the accompanying drawings and the description below. Other features and advantages will become apparent from the description, the drawings, and the claims.

BRIEF DESCRIPTION OF THE DRAWINGS

Like reference symbols in the various drawings indicate like elements.

DETAILED DESCRIPTION OF THE PREFERRED EMBODIMENTS

Figure 1:
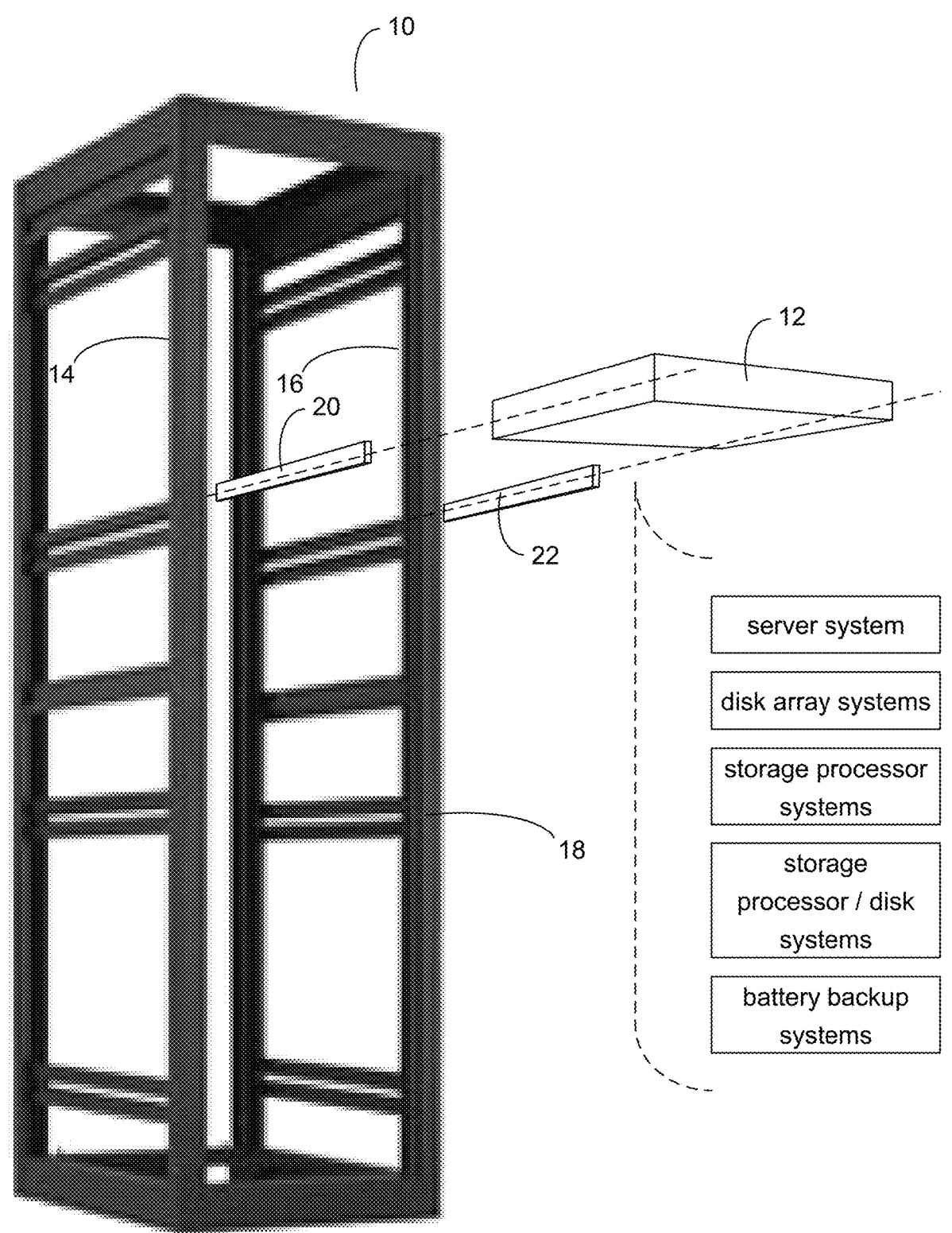
FIG. 1 is a perspective view of an IT rack and an IT component.

Referring to FIG. 1, IT racks (e.g., IT rack 10) may be utilized to store and organize IT components. For example, IT rack 10 may be placed within a computer room and various IT components (e.g., IT component 12) may be attached to rails (e.g., NEMA rails 14, 16) included within IT rack 10, wherein these rails (e.g., NEMA rails 14, 16) may have a standard and defined spacing between them (e.g., 19"). Typically, IT components that are configured to fit within IT rack 10 may be described as rack-mountable IT components.

Examples of the various IT components (e.g., IT component 12) mountable within IT rack 10 may include but are not limited to: server systems, disk array systems, storage processor systems, storage processor/disk systems, and battery backup systems.

IT rack 10 may include frame 18 (which may include one or more vertical supports, horizontal supports, and cross braces) to which NEMA rails 14, 16 may be attached. NEMA rails 14, 16 may include a plurality of evenly spaced holes that may be configured for mounting the various IT components within IT rack 10. By standardizing the spacing between NEMA rails 14, 16, the various IT devices that fit within a first IT rack may also fit within a second IT rack.

These various IT components (e.g., IT component 12) may be available in standardized heights based upon the number of rack units (U's). Examples of such standardized heights may include but are not limited to 1 U IT components, 2 U IT components, 3 U IT components, and 4 U IT components, wherein a 1 U IT component is half as high as a 2 U IT component, which is half as high as a 4 U IT component.

IT racks (e.g., IT rack 10) may be available in various heights, which are capable of accommodating a defined number of rack units (U's). However, while the number of rack units available within a particular IT rack may be rigidly defined by the height of the IT rack, the number of IT components mountable within that IT rack may vary depending upon the height in rack units (U's) of the particular IT components being mounted within that IT rack. Therefore, by reducing the number of rack units utilized by a particular IT component within an IT rack, additional IT components may be mounted within the IT rack.

Figure 2:
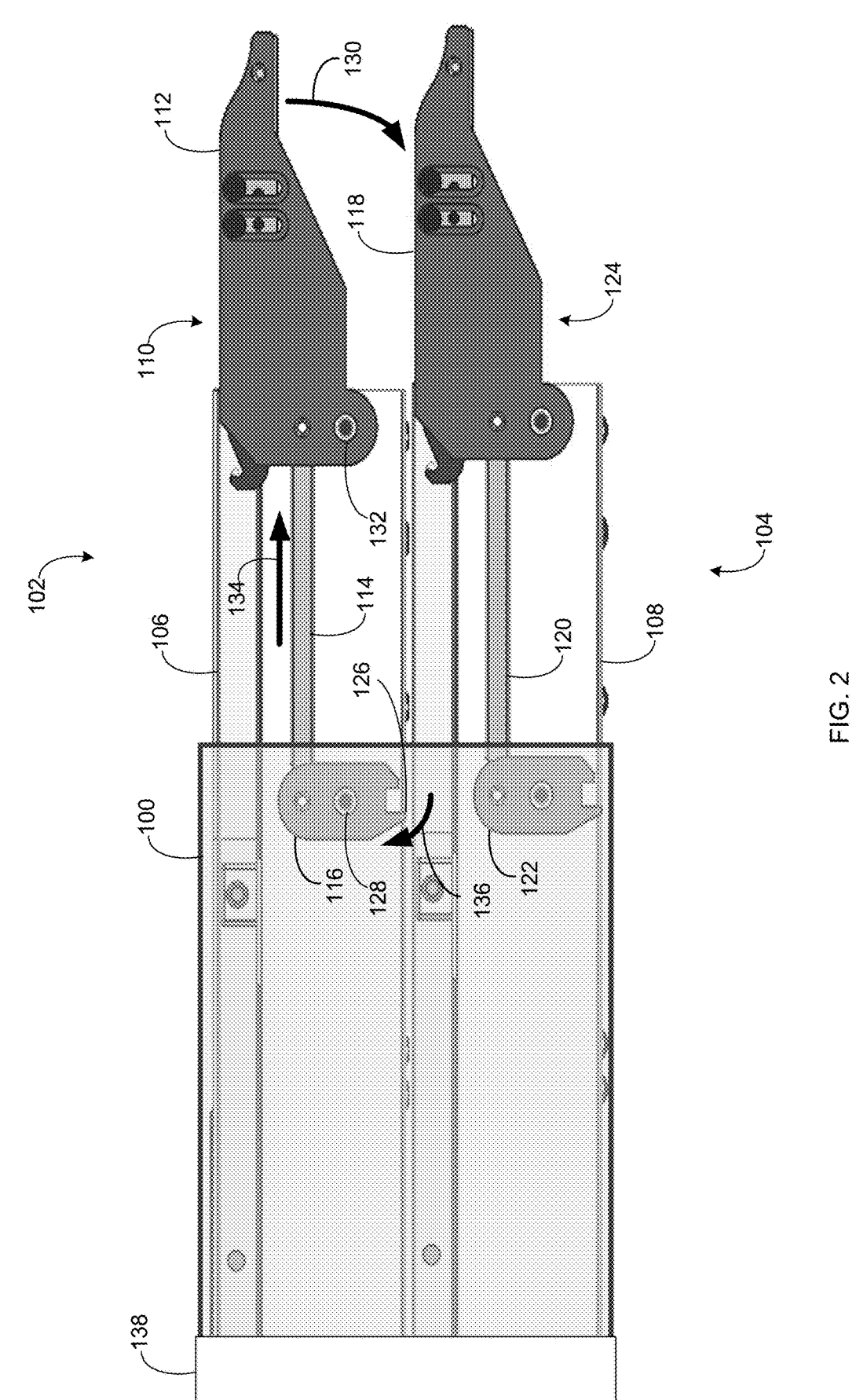
FIGS. 2-3 are side views of the IT component of FIG. 1.

Referring also to FIG. 2, there is shown the internal components of one implementation of IT component 12, wherein IT component 12 is shown to include chassis assembly 100 and chassis node coupling system 102. In this particular implementation, IT Component 12 is shown to be a 1 U IT component that includes two chassis node coupling systems (namely chassis node coupling systems 102, 104). Chassis node coupling system 102, 104 may be constructed of various materials, such as formed sheet metal, cast metal and/or molded plastic.

Each of the various chassis node coupling systems (e.g., chassis node coupling systems 102, 104) may include a chassis node (e.g., chassis nodes 106, 108) configured to be received at a first end of a chassis assembly (e.g., chassis assembly 100). Examples of chassis nodes 106, 108 may include but are not limited to one or more networking cards, one or more computing cards, one or more input-output (10) processing cards, one or more electro-mechanical hard disk drives, one or more solid-state/flash devices, etc. For example, a chassis node may be a computing node when the chassis node includes one or more central processing units (CPUs). In another example, the chassis node may be graphic processing node when the chassis node includes one or more graphical processing units (GPUs). In another example, the chassis node may be a power node when the chassis node includes a power supply configured to provide power to the IT component. While the above discussion concerns chassis node coupling system 102 with a chassis node (e.g., chassis node 106), it is understood that chassis node coupling system 102 may be configured to receive two chassis nodes. Accordingly and in the above-described implementation of IT component 12, IT component 12 is shown to include one chassis node per chassis node coupling system (e.g., chassis node 106 with chassis node coupling system 102 and chassis node 108 with chassis node coupling system 104).

While in the above-described example, chassis node coupling system 102 is described as including a single chassis node, this is for illustrative purposes only, as other configurations are possible and are considered to be within the scope of this disclosure. For example, storage device mounting system 102 may be configured to include e.g., two chassis nodes, three chassis nodes, or four chassis nodes.

As discussed above, as IT components and particular modules used in IT components are upgraded, traditional chassis designs are unable to adapt to changing dimensions. Accordingly, with new modules and IT components, the physical chassis structures must also be replaced, resulting in IT infrastructure unavailability. There are several cases that require enlarging card dimensions. For example, newer or larger chassis nodes or cards may consume more power, thus requiring more cooling using larger heat-sinks or fans.

In another example, a different card or module design may require more space within a chassis (e.g., from a new card design with two central processing units (CPUs) instead of one).

As discussed above, traditional chassis assembly design generally prohibits changing the depth dimensions of a card or module inserted into the chassis assembly. As such, a storage system administrator may be forced to replace an entire chassis assembly with a larger one to accommodate larger chassis nodes. However, chassis replacement may be a "fork-lift" upgrade that creates bad user experience, requires more rack space to support live upgrades, and generally add costs to the overall solution. Further, different chassis sizes in a product line family may create problems of hot in place upgrades across product line models. Additionally, some customers may have strict restrictions on the chassis assembly size (rack depth limits), forcing specific chassis assembly sizes, which may cause a customer to use multiple chassis assembly options to support different module or card size requirements. Accordingly and as will be discussed in greater detail below, chassis node coupling system 102 may allow for changes in storage system dimensions without disruption or downtime by releasably coupling multiple chassis nodes of varying sizes that are configured to operate simultaneously in the storage system with other chassis nodes (e.g., redundant chassis nodes).

Figure 3:
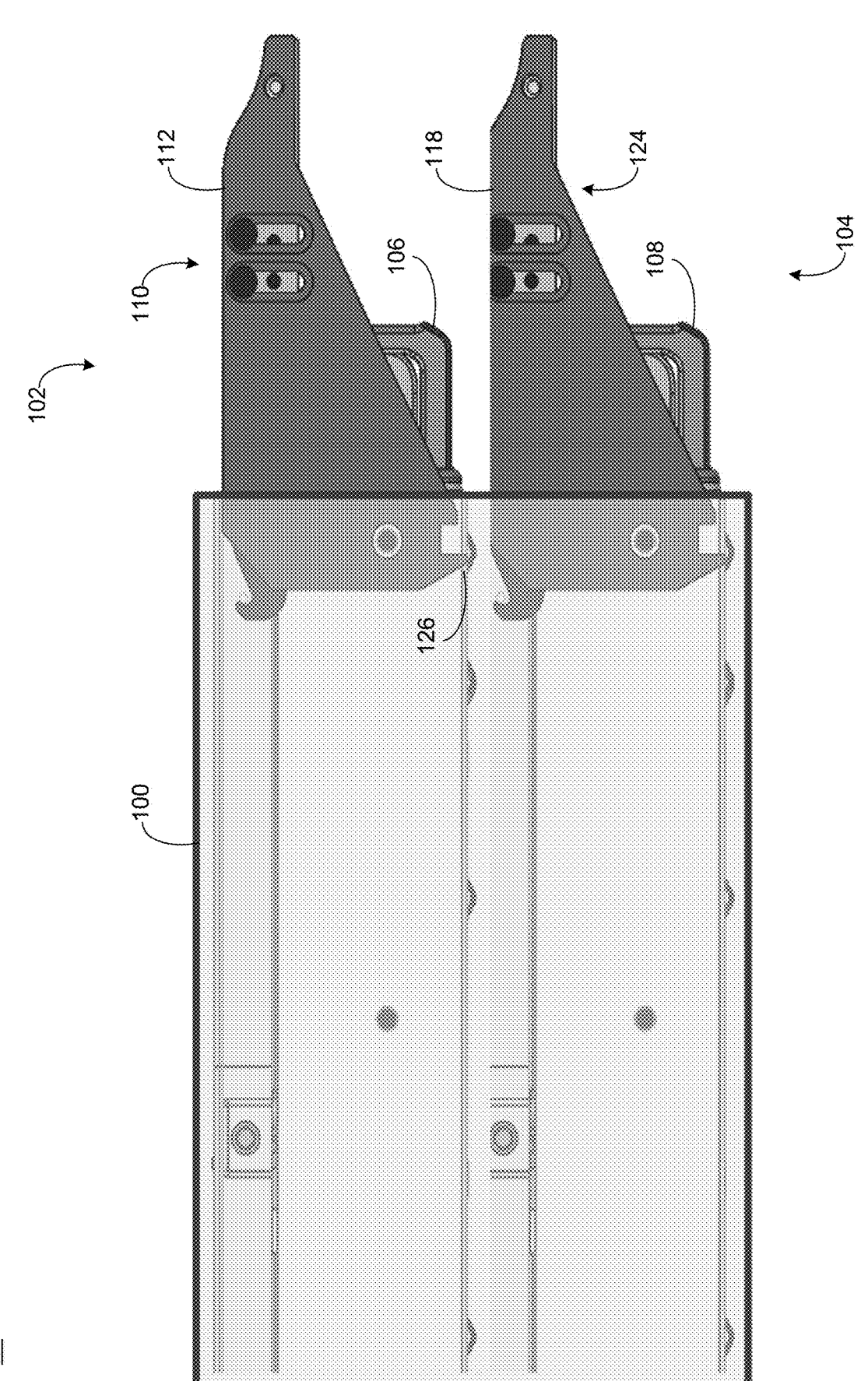

The size of chassis node 106 may exceed the size of chassis assembly 100. For example, chassis assembly 100 may have predefined dimensions (e.g., length, width, and/or height) that is configured to receive a chassis node or card with corresponding dimensions (e.g., length, width, and/or height). Referring also to FIG. 3, chassis assembly 100 may be configured to receive one or more chassis nodes (e.g., chassis nodes 106, 108) that are configured to be fully received and encased by chassis assembly 100. Referring again to FIG. 2, chassis node 106 may extend beyond the edge of chassis assembly 100 such that at least a portion of chassis node 106 is not encased by chassis assembly 100. Accordingly, it will be appreciated that chassis node 106 may be of any length that is greater than the length of chassis assembly 100 within the scope of the present disclosure. While the example of FIG. 2 shows chassis node 106 with a length that exceeds the length of chassis assembly 100, it will be appreciated that the height and/or depth of chassis node 106 may exceed the height and/or depth of chassis assembly 100 within the scope of the present disclosure.

Chassis assembly 100 may be enclosed in electromagnetic shielding. For example, conventional chassis assemblies may be enclosed in electromagnetic shielding. In this manner, chassis assembly 100 may provide electromagnetic compatibility (EMC) protection by creating a Faraday cage shielding effect for a chassis assembly and enclosed chassis nodes or cards. As is known in the art, EMC may indicate whether an electronic device is protected from external electromagnetic signals or from stronger signals leaking out and interfering with surrounding electronics. As shown in FIG. 3, when chassis assembly 100 is enclosed in electromagnetic shielding, chassis assembly 100 may provide electromagnetic shielding for chassis nodes 106, 108 coupled to and/or encased within chassis assembly 100.

Chassis node 106 may be enclosed in electromagnetic shielding. For example, chassis node 106 may be enclosed in electromagnetic shielding independent of whether chassis assembly is electromagnetic shielding. Otherwise, any exposed portion of chassis node 106 may be unprotected from electromagnetic interference. As such, regardless of whether or not chassis assembly 100 is enclosed in electromagnetic shielding, the entirety of chassis node coupling system 102 may be EMC compliant.

Chassis node coupling system 102 may further include a latch assembly (e.g., latch assembly 110) with one or more coupling assemblies (e.g., coupling assemblies 112, 114, 116) configured to releasably couple chassis node 106 to chassis assembly 100. In this example, latch assembly 110 may include first coupling assembly 112, second coupling assembly 114, and third coupling assembly 116 where first coupling assembly 112 may be positioned on the exposed end of chassis node 106, second coupling assembly 114 may be coupled to first coupling assembly 112 on one end and to third coupling assembly 116 on the other with third coupling assembly positioned within chassis assembly 100. However, it will be appreciated that latching assembly 110 may include more or fewer coupling assemblies within the scope of the present disclosure. While reference has been made coupling assemblies 112, 114, 116 of latch assembly 110 of chassis node coupling system 102, it will be appreciated that the above description may equally apply to coupling assemblies 118, 120, 122 of latch assembly 124 of chassis node coupling system 104.

Coupling assembly 116 of latch assembly 110 may be configured to engage with one or more corresponding coupling features (e.g., corresponding coupling feature 126) on chassis assembly 100. Coupling assembly 116 may be configured to pivot about pivot 128 such that one or more protrusions on the body of coupling assembly 116 on or within one or more apertures (e.g., corresponding coupling feature 126) of chassis assembly 100 as latch assembly is engaged (as will be discussed in greater detail below). While an example has been described with coupling assembly 116 including one or more protrusions and chassis assembly 100 including one or more apertures, it will be appreciated that various other types of corresponding features may be used within the scope of the present disclosure. For example, coupling assembly 116 may include one or more apertures and chassis assembly 100 may include one or more protrusions and/or coupling assembly 116 and chassis assembly 100 may each include various corresponding features configured to engage to secure chassis node 106 within chassis assembly 100.

As shown in FIGS. 2-3, the one or more corresponding coupling features (e.g., corresponding feature 126) may be positioned at a predefined distance from the first end of chassis assembly 100. Accordingly, chassis assembly 100 may be utilized for various chassis node sizes (e.g., length of chassis node 106 in FIG. 2 vs. length of chassis node 106 in FIG. 3) by engaging with the same corresponding coupling features in chassis assembly 100.

Figure 4:
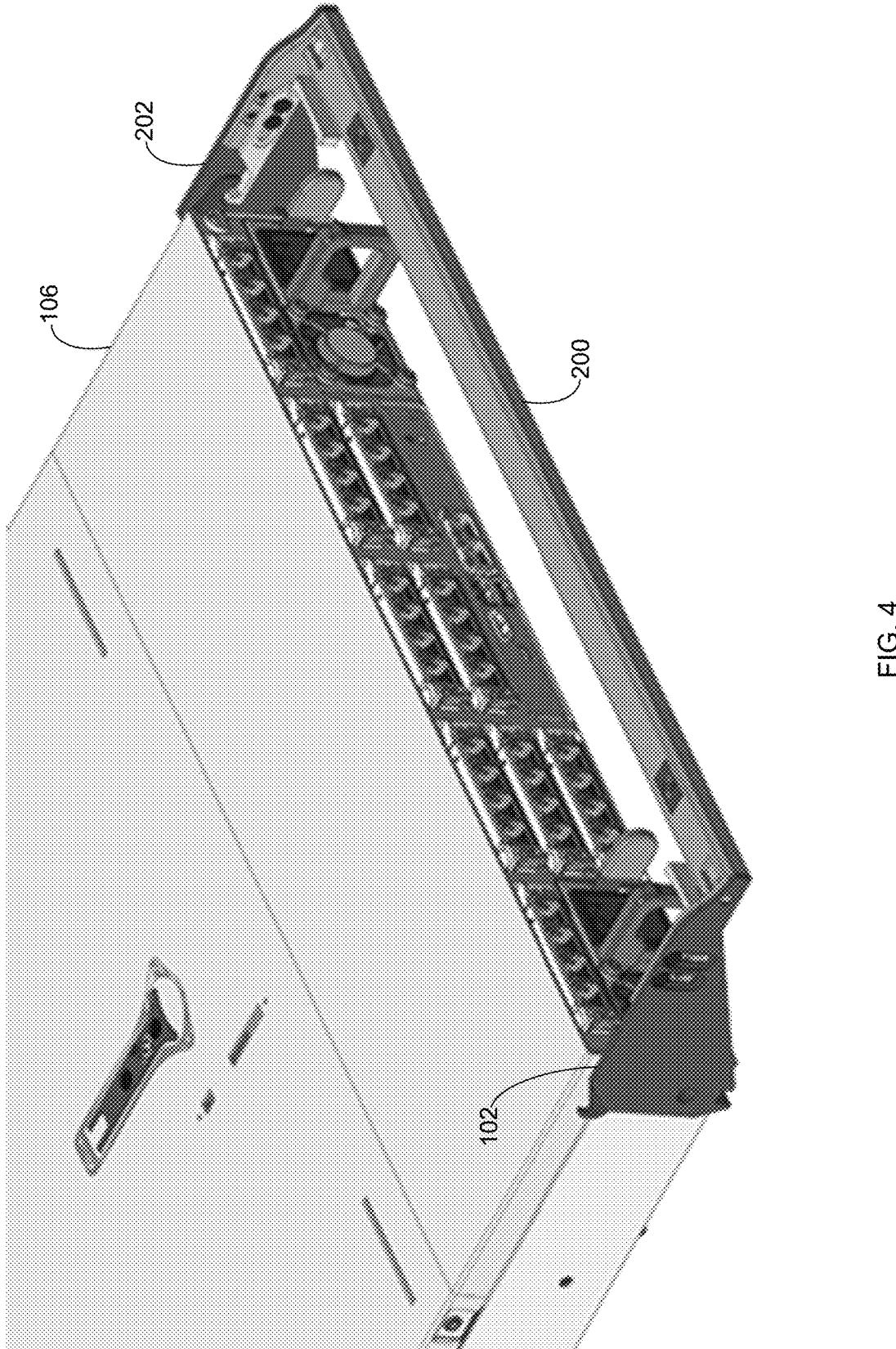
FIG. 4 is a perspective view of a retention assembly of the IT component of FIG. 1.

Referring also to FIG. 4, latch assembly 110 may include a handle portion (e.g., handle portion 200) positioned adjacent to a distal end of chassis node 106 and coupled to the one or more coupling assemblies (e.g., coupling assemblies 112, 114, 116). Handle portion 200 may couple a latch assembly on opposite sides of chassis node 106. For example, by utilizing handle portion 200, a pair of latch assemblies 102, 202 may be engaged and/or disengaged. Referring again to FIG. 2, handle portion 200 may be configured to decouple one or more coupling assemblies 112, 114, 116 of latch assembly 110 from chassis assembly 100. As shown in FIG. 2, handle portion 200 may be pressed downward (e.g., shown with arrow 130) causing coupling assembly 112 to pivot about pivot 132 and pull coupling assembly 114 (e.g., shown with arrow 134). By pulling coupling assembly 136, coupling assembly 116 may be pivoted about pivot 128 to disengage corresponding feature

130 of chassis assembly 100. In this manner, chassis node coupling system 102 may allow for chassis node 106 to be removed from chassis assembly 100.

Similarly, by pulling handle portion 200 upwards (e.g., in direction opposite of arrow 130), coupling assembly 112 may push coupling assembly 114 toward chassis assembly 100 (e.g., in direction opposite of arrow 134) and cause coupling assembly 116 to pivot about pivot 128 in the direction opposite of arrow 136 to engage coupling assembly 116 with corresponding feature 130 of chassis assembly 100. In this manner, chassis node coupling system 102 may allow for chassis node 106 to be releasably coupled to chassis assembly 100.

Chassis node 106 may be configured to be releasably coupled within the first end of the chassis assembly to one or more computing devices while the one or more computing devices are online. For example and as discussed above, by utilizing chassis node coupling system 102, chassis node 106 may be releasably coupled to a computing device (e.g., computing device 138). In some embodiments, computing device 138 and chassis node 106 may include corresponding coupling features to allow power and data to be conveyed between computing device 138 and chassis node 106. As discussed above, with chassis node coupling system 102, chassis node 106 may be utilized within chassis assembly 100 without requiring any changes to chassis assembly 100 and the related components of chassis assembly 100. In this manner, chassis node coupling system 102 may provide chassis nodes/cards of various lengths to be inserted into chassis assembly 100 without taking the computing device (e.g., computing device 138) offline.

Additionally and as discussed above, chassis node coupling system 102 may allow for changes in storage system dimensions without disruption or downtime (e.g., without taking IT devices or computing devices offline) by releasably coupling multiple chassis nodes of varying sizes that are configured to operate simultaneously in the IT component (e.g., IT component 12) with other chassis nodes (e.g., redundant chassis nodes). For example, a computing device (e.g., computing device 138) may include a storage processor configured to process data between various components within and external to the IT component (IT component 12). Accordingly, chassis node coupling system 102 may allow various sized chassis nodes (e.g., chassis node 106) to be utilized in a chassis assembly (e.g., chassis assembly 100) with redundant chassis nodes (e.g., chassis node 108) while the computing device (e.g., computing device 138 or other storage processing devices of IT component 12) is online (e.g., without taking computing device 138 or storage processing devices of IT component 12 offline).

General:

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

A number of implementations have been described. Having thus described the disclosure of the present application in detail and by reference to embodiments thereof, it will be apparent that modifications and variations are possible without departing from the scope of the disclosure defined in the appended claims.

What is claimed is:

1. A chassis node coupling system comprising:

a first chassis node configured to be received at a first end of a chassis assembly enclosure, wherein a chassis node size of the first chassis node is contained within the chassis assembly enclosure and does not extend beyond the first end of the chassis assembly enclosure;

a second chassis node configured to be received at the first end of the chassis assembly enclosure, wherein the chassis assembly enclosure includes one or more coupling features on opposite sides of the first end within the chassis assembly enclosure for engaging with a pair of latch assemblies on opposite sides of the second chassis node, wherein a chassis node size of the second chassis node exceeds a chassis assembly enclosure size and extends beyond the first end of the chassis assembly enclosure;

the pair of the latch assemblies positioned on opposite sides of the second chassis node, wherein each latch assembly of the pair of the latch assemblies includes a first coupling assembly positioned on an exposed end of the second chassis node, a second coupling assembly coupled to the first coupling assembly at one end of the second coupling assembly, extending laterally into the chassis assembly enclosure in parallel with a lateral direction of insertion of the second chassis node into the chassis assembly enclosure, and coupled to a third coupling assembly on an opposite end of the second coupling assembly, and the third coupling assembly positioned within the chassis assembly enclosure; and a handle portion coupled to the at least one latch assembly of the pair of the latch assemblies on the opposite sides of the second chassis node and is positioned adjacent to the exposed end of the second chassis node, wherein pressing the handle portion downward disengages the pair of latch assemblies on the opposite sides of the second chassis node for decoupling the third coupling assembly of each latch assembly of the pair of latch assemblies from the one or more coupling features on opposite sides of the first end within the chassis assembly enclosure by:

pivoting the first coupling assembly of each latch assembly about a respective pivot point on each side of the second chassis node, pulling the second coupling assembly laterally toward the exposed end of the second chassis node, and pivoting the third coupling assembly of each latch assembly about a respective pivot point on the opposite sides of the second chassis node to disengage a respective coupling feature within the chassis assembly enclosure, wherein the one or more coupling features are positioned at a predefined distance from the first end of the chassis assembly enclosure to be utilized for various chassis node sizes by engaging with the same one or more coupling features in the chassis assembly enclosure, and wherein the second chassis node is configured to be releasably coupled within the first end of the chassis assembly enclosure to a computing device while the computing device is online, wherein the second chassis node is configured to be releasably coupled to the chassis assembly enclosure including pulling the handle portion upwards, wherein the first coupling assembly pushes the second coupling assembly laterally toward the chassis assembly enclosure and causes the third coupling assembly to engage with the respective coupling feature of the chassis assembly enclosure.

2. The chassis node coupling system of claim 1, wherein the chassis assembly enclosure is enclosed in electromagnetic shielding.

3. The chassis node coupling system of claim 2, wherein the second chassis node is enclosed in electromagnetic shielding.

4. The chassis node coupling system of claim 1, wherein the handle portion is configured to decouple the one or more coupling features of the latch assembly from the chassis assembly enclosure.

5. The chassis node coupling system of claim 1, wherein the chassis assembly enclosure is a portion of an IT component.

6. The chassis node coupling system of claim 5, wherein the IT component is chosen from the group consisting of: a server system, a disk array system, a storage processor system, and a storage processor/disk system.

7. An IT component comprising:

a chassis assembly; and a chassis node coupling system comprising:

a first chassis node configured to be received at a first end of a chassis assembly enclosure, wherein a chassis node size of the first chassis node is contained within the chassis assembly enclosure and does not extend beyond the first end of the chassis assembly enclosure;

a second chassis node configured to be received at the first end of the chassis assembly enclosure, wherein the chassis assembly enclosure includes one or more coupling features on opposite sides of the first end within the chassis assembly enclosure for engaging with a pair of latch assemblies on opposite sides of the second chassis node, wherein a chassis node size of the second chassis node exceeds a chassis assembly enclosure size and extends beyond the first end of the chassis assembly enclosure;

the pair of the latch assemblies positioned on opposite sides of the second chassis node, wherein each latch assembly of the pair of the latch assemblies includes a first coupling assembly positioned on an exposed end of the second chassis node, a second coupling assembly coupled to the first coupling assembly at one end of the second coupling assembly, extending laterally into the chassis assembly enclosure in parallel with a lateral direction of insertion of the second chassis node into the chassis assembly enclosure, and coupled to a third coupling assembly on an opposite end of the second coupling assembly, and the third coupling assembly positioned within the chassis assembly enclosure; and a handle portion coupled to the at least one latch assembly of the pair of the latch assemblies on the opposite sides of the second chassis node and is positioned adjacent to the exposed end of the second chassis node, wherein pressing the handle portion downward disengages the pair of latch assemblies on the opposite sides of the second chassis node for decoupling the third coupling assembly of each latch assembly of the pair of latch assemblies from the one or more coupling features on opposite sides of the first end within the chassis assembly enclosure by:

pivoting the first coupling assembly of each latch assembly about a respective pivot point on each side of the second chassis node, pulling the second coupling assembly laterally toward the exposed end of the second chassis node, and pivoting the third coupling assembly of each latch assembly about a respective pivot point on the opposite sides of the second chassis node to disengage a respective coupling feature within the chassis assembly enclosure, wherein the one or more coupling features are positioned at a predefined distance from the first end of the chassis assembly enclosure to be utilized for various chassis node sizes by engaging with the same one or more coupling features in the chassis assembly enclosure, and wherein the second chassis node is configured to be releasably coupled within the first end of the chassis assembly enclosure to a computing device while the computing device is online, wherein the second chassis node is configured to be releasably coupled to the chassis assembly enclosure including pulling the handle portion upwards, wherein the first coupling assembly pushes the second coupling assembly laterally toward the chassis assembly enclosure and causes the third coupling assembly to engage with the respective coupling feature of the chassis assembly enclosure.

8. The IT component of claim 7, wherein the chassis assembly is enclosed in electromagnetic shielding.

9. The IT component of claim 8, wherein the second chassis node is enclosed in electromagnetic shielding.

10. The IT component of claim 7, wherein the handle portion is configured to decouple the one or more coupling features of the latch assembly from the chassis assembly.

11. The IT component of claim 7, wherein the IT component is chosen from the group consisting of: a server system, a disk array system, a storage processor system, and a storage processor/disk system.

12. The IT component of claim 7, wherein the IT component is chosen from the group consisting of:

a 1U IT component;

a 2U IT component; and a 3U IT component.

\* \* \* \* \*